United States Patent
Doutreloigne et al.

(10) Patent No.: US 9,082,915 B2
(45) Date of Patent: Jul. 14, 2015

(54) LOW VOLTAGE DROP UNIDIRECTIONAL SMART BYPASS ELEMENTS

(71) Applicants: IMEC, Leuven (BE); Universiteit Gent, Ghent (BE)

(72) Inventors: Jan Doutreloigne, Deinze (BE); Pieter Bauwens, Ghent (BE)

(73) Assignees: IMEC, Leuven (BE); Universiteit Gent, Gent (BE)

( * ) Notice: Subject to any disclaimer, the term of this patent is extended or adjusted under 35 U.S.C. 154(b) by 66 days.

(21) Appl. No.: 13/860,438

(22) Filed: Apr. 10, 2013

(65) Prior Publication Data

US 2013/0333741 A1  Dec. 19, 2013

Related U.S. Application Data

(60) Provisional application No. 61/622,852, filed on Apr. 11, 2012.

(51) Int. Cl.

| | |
|---|---|
| *H01L 31/05* | (2014.01) |
| *H01L 31/02* | (2006.01) |
| *H03K 17/06* | (2006.01) |
| *H01L 31/042* | (2014.01) |
| *H03K 17/687* | (2006.01) |

(52) U.S. Cl.
CPC ...... *H01L 31/0504* (2013.01); *H01L 31/02021* (2013.01); *H02S 40/00* (2013.01); *H03K 17/06* (2013.01); *H03K 17/687* (2013.01); *Y02E 10/50* (2013.01)

(58) Field of Classification Search
CPC ............... H01L 31/02021; H01L 31/0504
USPC ......................................................... 136/244
See application file for complete search history.

(56) References Cited

U.S. PATENT DOCUMENTS

| | | | | |
|---|---|---|---|---|
| 3,990,100 | A | * | 11/1976 | Mamine et al. ............ 257/437 |
| 4,384,259 | A | * | 5/1983 | Capewell .................... 330/10 |
| 4,450,787 | A | * | 5/1984 | Weakliem et al. ...... 118/723 ER |
| 5,679,176 | A | * | 10/1997 | Tsuzuki et al. ............ 136/251 |

(Continued)

FOREIGN PATENT DOCUMENTS

| | | |
|---|---|---|
| DE | 101 17 360 A1 | 4/2001 |
| DE | 102 27 832 C1 | 6/2002 |

OTHER PUBLICATIONS

Extended European Search Report dated Jul. 26, 2013 in EP Application No. 13161831.6.

*Primary Examiner* — Golam Mowla
(74) *Attorney, Agent, or Firm* — Knobbe Martens Olson & Bear LLP

(57) ABSTRACT

Described herein is a low-voltage unidirectional bypass element connected across a solar cell and operable to allow current to flow when the operation of the solar cell is suspended. The bypass element includes a single field effect transistor connected between first and second terminals as a switch, and a detection circuit for detecting suspension of the solar cell's operation and activating the switch to bypass the solar cell in the event of its operation suspension. Diodes are connected in parallel with the normally-open switch and receive current, when the solar cell's operation is suspended, to trigger operation of the detection circuit. The detection circuit includes a charge pump, a timer circuit, a control generation unit and a switch control circuit. The switch control circuit generates a control signal to close the switch and to allow current to bypass the solar cell.

19 Claims, 11 Drawing Sheets

(56) References Cited

U.S. PATENT DOCUMENTS

| | | |
|---|---|---|
| 7,969,757 B2* | 6/2011 | Kernahan ........................ 363/98 |
| 2003/0067286 A1 | 4/2003 | Tihanyi |
| 2005/0139259 A1* | 6/2005 | Steigerwald et al. ......... 136/293 |
| 2007/0160747 A1* | 7/2007 | Mitzi et al. ..................... 427/74 |
| 2008/0156368 A1* | 7/2008 | Hirose et al. .................. 136/256 |
| 2008/0198523 A1 | 8/2008 | Schmidt et al. |
| 2009/0184746 A1 | 7/2009 | Fahrenbruch |
| 2010/0071746 A1* | 3/2010 | Furumura et al. ............ 136/244 |
| 2010/0163093 A1* | 7/2010 | Boulanger et al. ........... 136/244 |
| 2011/0006232 A1 | 1/2011 | Fahrenbruch et al. |
| 2011/0079263 A1 | 4/2011 | Avrutsky |

\* cited by examiner

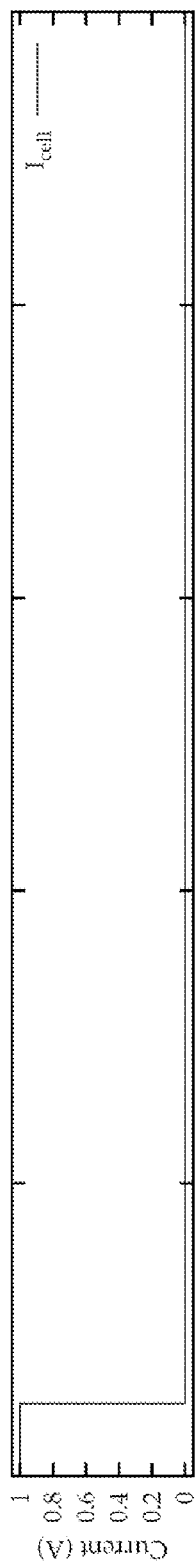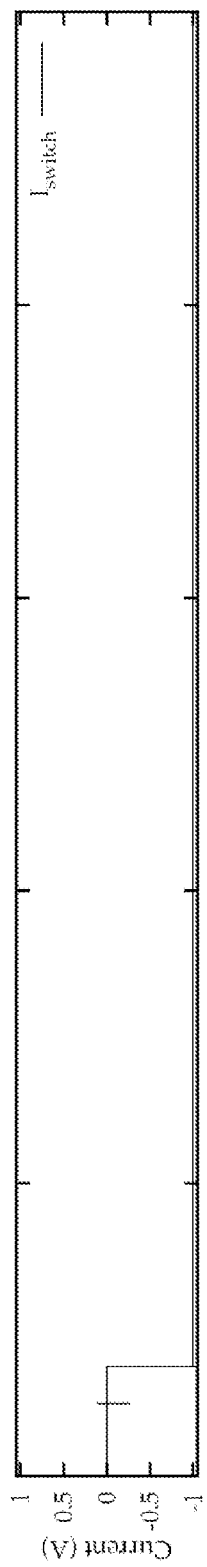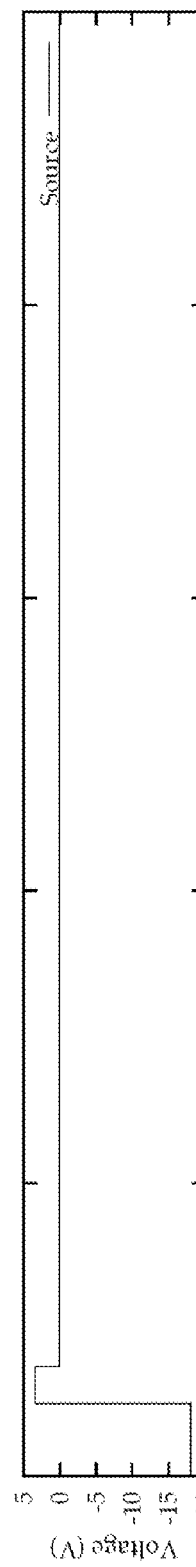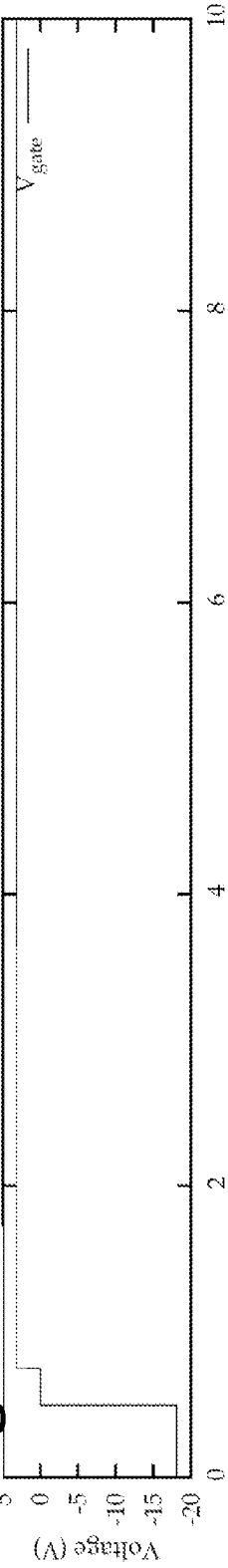

LOW VOLTAGE DROP UNIDIRECTIONAL SMART BYPASS ELEMENTS

CROSS REFERENCE TO RELATED APPLICATIONS

This application claims priority under 35 U.S.C. §119(e) to U.S. provisional patent application 61/622,852 filed on Apr. 11, 2012, which application is hereby incorporated by reference in its entirety.

BACKGROUND OF THE INVENTION

1. Field of the Invention

The disclosed technology relates to low voltage drop unidirectional smart bypass elements, and more particularly, although not exclusively, concerned with unidirectional bypass elements for use in photovoltaic panel solar modules to provide a current bypass in the event of suspension of operation of at least one photovoltaic solar cell in such modules.

2. Description of the Related Technology

Large-area photovoltaic (PV) panels tend to be composed of multiple individual solar cells connected in series to deliver a large amount of electrical power to the load. Arranging the solar cells in series allows the energy transfer to be accomplished at low current levels and at a relative high voltage level, thereby minimizing the power losses in the power lines. This configuration works very well provided that all solar cells are receiving the same amount of optical energy, namely, all solar cells contribute equally to the overall power conversion. However, in the case when one solar cell in the module starts receiving less optical energy because it is temporarily in the shade or because its surface has become dirty, the current in the series connection of all solar cells will be limited by this "failing" cell. As a result, not only the power of the "failing" cell itself is lost, but also the power generation of the working solar cells is dramatically reduced. In the case where the current of the failing solar cell drops to zero, the power conversion is completely suspended and the whole solar module in the PV panel becomes non-functioning. Furthermore, the voltage from the functioning cells will be placed in reverse over this "failing" cell. If this voltage is greater than the breakdown voltage of this cell, it will break down dissipating the power generated by the other cells and creating a local hot spot. Such breakdown may permanently damage the PV panel.

US-A-2009/0184746 describes a low voltage drop unidirectional electronically-controlled switch for use with a solar or PV panel to bypass a "failing" cell by blocking current flow when the electronic switch is open and to pass current when the electronically-controlled switch is closed. The electronically-controlled switch is controlled by a control circuit and is refreshed periodically. The electronically-controlled switch is implemented by a pair of reverse serially connected field effect transistors (FETs), such as NMOSFET devices, the drain of each of the serially connected FET devices forming the terminals of the electronically-controlled switch. The control circuit refreshes the operational status of the electronically-controlled switch to ensure that the switch is closed only for the shortest time possible, for example, in the case of the PV panel acting as a "failing" cell due to the traverse of a cloud over the sun which blocks the generation of current for a given period of time.

However, the power dissipated when one or more solar cells is bypassed is substantial, and the operation of the PV solar panel becomes less efficient. Moreover, the power lost to the system is emitted as heat, which determines thermal considerations in the PV solar panel layout, the design of the electronically-controlled switch and ultimately the cost of the arrangement.

SUMMARY OF THE CERTAIN INVENTIVE ASPECTS

Certain inventive aspects relate to an improved smart bypass element for a photovoltaic panel which overcomes certain disadvantages associated with known bypass elements or switches.

In accordance with the first aspect of the present disclosure a low voltage unidirectional smart bypass element is provided for use with at least one photovoltaic solar cell and configured to receive current when the operation of the at least one photovoltaic cell is suspended, the element comprising: a first terminal, a second terminal, an electronically-controlled switch arranged between the first and second terminals and operable to allow the flow of electrical current between the first terminal and the second terminal when the electronically-controlled switch is closed; and a detection circuit arranged for controlling the operation of the electronically-controlled switch, wherein the electronically-controlled switch consists of a single field effect transistor having a source terminal, drain terminal, gate terminal and bulk terminal.

By having a single field effect transistor, the power loss of the smart bypass element is substantially reduced for a semiconductor chip on which the smart bypass element is formed having an area equivalent to known bypass elements or switches.

Alternatively, the size of a semiconductor chip on which the smart bypass element is formed can be substantially reduced for an equivalent power loss as that of known bypass elements or switches.

The detection circuit may comprise at least one diode arranged in parallel with the field effect transistor for detecting a potential difference between the first and second terminals. In one embodiment, a plurality of diodes are utilized for detecting the potential difference.

The detection circuit may further comprise a power converter unit for obtaining and storing electrical energy; a timer for generating control signals at regular time intervals, the control signals being indicative of the amount of electrical energy stored during these regular time intervals; and a switch control unit arranged for receiving the control signals and outputting a signal for controlling operation of the field effect transistor.

The smart bypass element according to the first aspect of the present disclosure wherein the power converter unit is arranged for obtaining and storing electrical energy when the electrical potential of the second terminal exceeds the electrical potential of the voltage source connected to the first terminal.

In one embodiment, the power converter unit is connected to the second terminal via a rectifier circuit. The rectifier circuit may comprise a high voltage diode.

The first and second terminals may respectively be connected to the drain terminal and the source terminal of the field effect transistor.

The first terminal may further be connected to a reference voltage source. This reference voltage source may be at ground (0V).

In one embodiment, the operation of the electronically-controlled switch is controlled via its gate terminal in response to the electrical potential difference detected by the detection circuit between the first and second terminals.

The bulk terminal of the field effect transistor is advantageously configured to be electrically floating.

The field effect transistor may comprise one of an n-channel metal oxide semiconductor field effect transistor, a p-channel metal oxide semiconductor field effect transistor, an n-channel double-diffused metal oxide semiconductor field effect transistor, and a p-channel double-diffused metal oxide semiconductor field effect transistor.

In accordance with a further aspect of the present disclosure, a photovoltaic solar array is provided which comprises a plurality of photovoltaic solar cells arranged in at least one substring within the array, and a low voltage unidirectional smart bypass element as described above connected in parallel across each substring, and arranged for providing an alternative current path between the input node and the output node when the operation of at least one photovoltaic solar cell is suspended.

In further aspects of the present disclosure, photovoltaic solar panels are provided which comprise: an input node; an output node; and at least one photovoltaic solar array described above connected between the input and output nodes.

In accordance with a second aspect of the present disclosure a photovoltaic solar panel is provided which comprises: an input node; an output node; at least two solar cells connected in series between the input and output node, and at least one low voltage unidirectional smart bypass element, according to the first aspect, arranged for providing an alternative current path between the input node and output node when the operation of at least one solar cell in the panel is suspended.

In one embodiment according to the second aspect of the present disclosure, each solar cell is connected to a smart bypass element. In another embodiment according to the second aspect of the present disclosure, the smart bypass element is connected between the input node and output node of the photovoltaic solar panel.

BRIEF DESCRIPTION OF THE DRAWINGS

For a better understanding of the present disclosure, reference will now be made, by way of example only, to the accompanying drawings in which

FIGS. 5A to 5D illustrate the simulated operation of the embodiment shown in FIG. 4;

DETAILED DESCRIPTION OF CERTAIN ILLUSTRATIVE EMBODIMENTS

Figure 1:
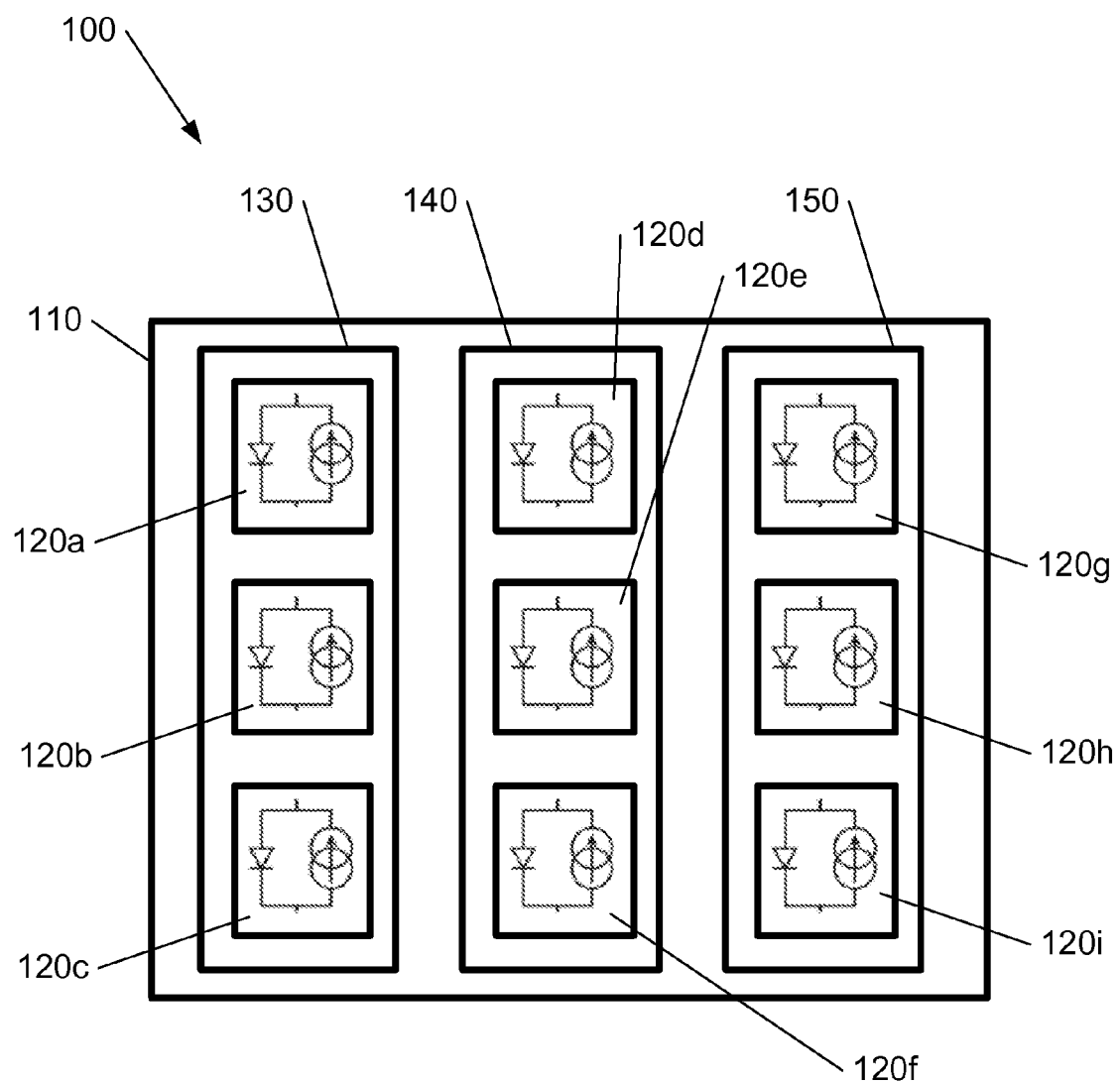
FIG. 1 illustrates a state of the art photovoltaic solar panel unit.

The present disclosure will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

It will be understood that the terms "vertical" and "horizontal" are used herein refer to particular orientations of the Figures and these terms are not limitations to the specific embodiments described herein. Similarly, the use of the terms "top", "bottom", "upper", "lower" and the like in the description and the claims is solely for descriptive purposes and not necessarily for describing relative positions. It is to be understood that the terms so used are interchangeable under appropriate circumstances and that the preferred embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may do so. Furthermore, the particular features, structures or characteristics may be combined in any suitable manner, as would be apparent to one of ordinary skill in the art from this disclosure, in one or more embodiments.

Similarly, it should be appreciated that in the description of exemplary preferred embodiments, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this disclosure.

The disclosure will now be described by a detailed description of several preferred embodiments. It is clear that other preferred embodiments can be configured according to the knowledge of persons skilled in the art without departing from the true spirit or technical teaching of the disclosure as defined by the appended claims.

Certain embodiments provide a system and a method for realizing a low voltage drop bi-directional smart bypass element employing an electronic switch with negligible voltage drop when conducting for use as one of a photovoltaic (PV) solar panel bypass element or cell. This is provided according to one embodiment by designing a smart bypass element comprising a single field effect transistor (FET) arranged to operate as an electronically-controlled bypass switch, connected between a first terminal and a second terminal, wherein the bulk contact of the FET transistor is left floating, that is, not connected to a potential. A detection circuit can be further provided for detecting the state of the PV cell on periodic basis and for adjusting the state of the electronic bypass switch accordingly.

FIG. 1 illustrates a possible configuration of a PV solar panel 100 comprising a solar module 110. The solar module 110 consists of a plurality of solar cells 120a, 120b, 120c, 120d, 120e, 120f, 120g, 120h, 120i arranged in an array within the solar module 110. (A single solar cell as described below is referred to generically as "solar cell 120".) As shown, the solar module 110 comprises nine solar cells 120a, 120b, 120c, 120d, 120e, 120f, 120g, 120h, 120i but it will be appreciated that any suitable number of solar cells 120 may be provided in a solar module 110. In this configuration, the nine solar cells 120a, 120b, 120c, 120d, 120e, 120f, 120g, 120h, 120i are arranged in three identical substrings 130, 140, 150. In each substring 130, 140, 150, the solar cells 120a, 120b, 120c (substring 130), 120d, 120e, 120f (substring 140), 120g, 120h, 120i (substring 150) are connected in series (not shown). Additionally, each substring is connected in series with other substrings (not shown).

If one solar cell 120 fails or its operation becomes suspended, it affects the efficiency of the substring 130, 140, 150 of which it forms a part, as well as the efficiency of the entire PV panel. Such a solar cell is referred to as a "failing" solar cell and the term "failing solar cell" not only refers to a solar cell that has completely failed but also to one which, for some reason, the "failing" state is temporary, for example, with the passage of cloud which temporarily inhibits the normal operation of the solar cell. In addition, the term "suspended" as used below also refers to a solar cell whose operation has stopped for any reason either on a temporary or permanent basis.

Figure 2:
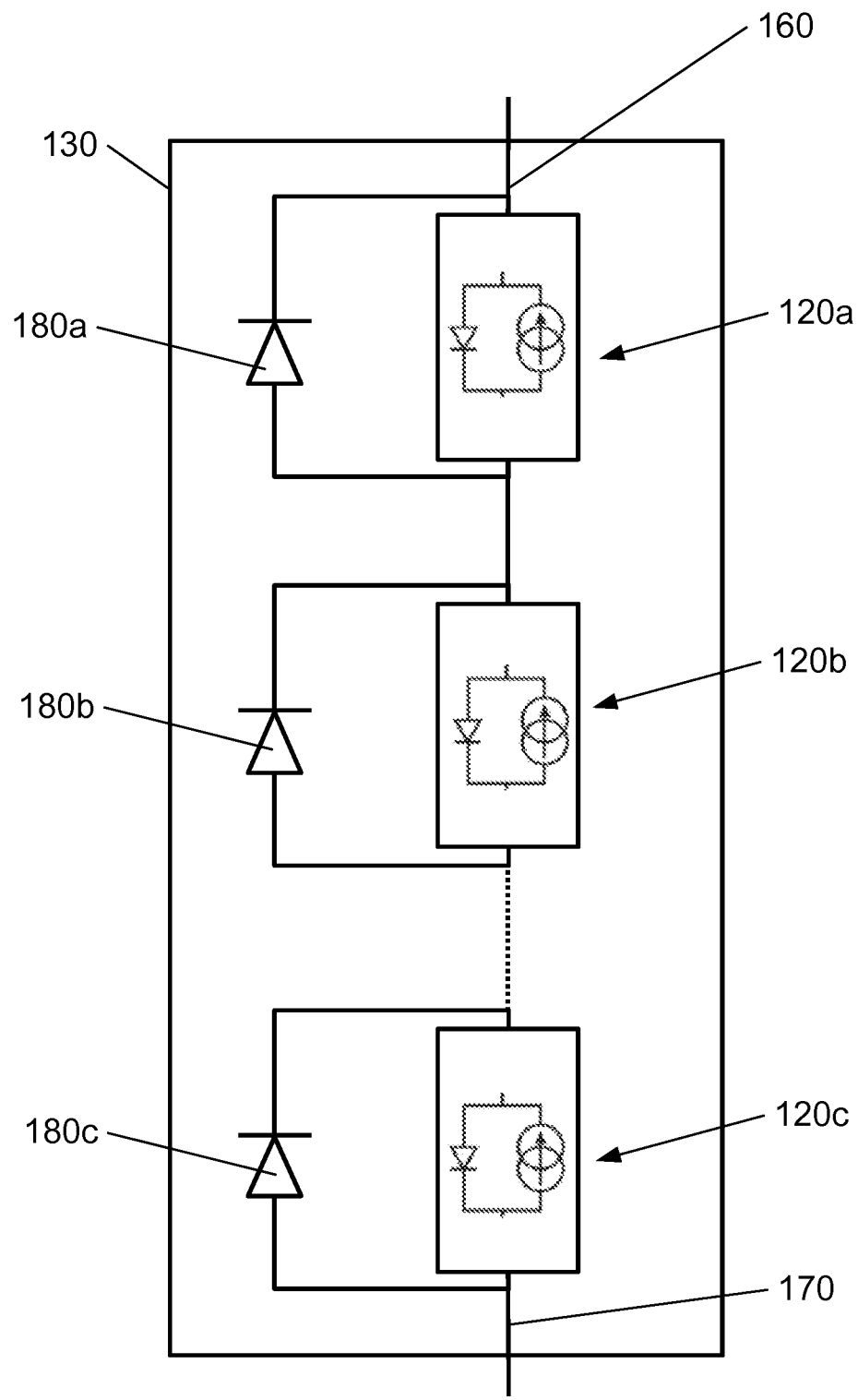
FIG. 2 illustrates a solution for providing a bypass switch in a photovoltaic solar cell.

A technique for bypassing a failing solar cell 120 is shown in FIG. 2. In FIG. 2, a substring 130 is shown with its solar cells 120a, 120b, 120c connected in series between a first node 160 and a second node 170, the first and second nodes 160, 170 serving as an input and an output for the substring 130. For each solar cell 120a, 120b, 120c, a diode 180a, 180b, 180c is associated with each solar cell 120a, 120b, 120c as shown. Each diode 180a, 180b, 180c is arranged to operate as a bypass switch so that electrical current can be bypassed around a failing solar cell 120a, 120b, 120c in the substring 130. Bypass diodes 180a, 180b, 180c are placed in parallel with their associated solar cells 120a, 120b, 120c to create an electrical bypass switch in order to create an alternative electrical current path between the first node 160 and the second node 170. (A single bypass diode as described below is referred to generically as "diode 180" or "bypass diode 180".)

In one embodiment, if the first node 160 serves as the input and the second node 170 serves as the output and solar cell 120a fails or its operation suspended, the electrical current path will flow from the first node 160 (input) through bypass diode 180a and then through each of solar cells 120b, 120c to the second node 170 (output). Similarly, if solar cell 120b fails or its operation suspended, the electrical current path will flow from the first node 160 (output) through the solar cell 120a, through bypass diode 180a and through solar cell 120c to the second node 170 (input). The electrical current path will flow from the first node 160 (output) through both the solar cells 120a, 120b and through the bypass diode 180c to the second node 170 (input) if solar cell 120c fails or its operation suspended.

Naturally, if more than one solar cell 120 fails or has its operation suspended in substring 130, the electrical current will flow through the associated bypass diode 180. In effect, the electrical current path is only diverted to the bypass diode 180 associated with the failing solar cell 120.

In FIG. 2, a bypass diode 180 is provided for each solar cell 120. However, it will be appreciated that a single bypass diode can be placed in parallel with more than one solar cell connected in series. In this case, the electrical current path will flow through the bypass diode when at least one of the solar cells in the series fails. Whilst, from a power efficiency point of view, a bypass placed in parallel with each cell may be favorable, this is not feasible in practice. The placement of the diodes on the solar PV panel, the connections with the solar cells and the overall cost of the solar PV panel limit the bypass diodes to one per series of solar cells.

As described above, the current will flow around a failing solar cell or a solar cell having its operation suspended, a series of solar cells or a substring in which at least one solar cell fails or has its operation suspended. In the state-of-the-art, the bypass diode is realized by means of a silicon PN junction diode placed in parallel with the solar cell or series of solar cells or substring. During operation, once the generated photocurrent of a particular solar cell 120 becomes smaller than the photocurrent of all other cells in the substring 130, a voltage reversal at an input terminal of the bypass diode 180 will occur. The amplitude of this is voltage reversal operates to turn on the bypass diode 180 thereby creating an alternative conductive path and allowing the electrical current generated by the functioning solar cells in the substring 130 to be bypassed around the failing solar cell or a solar cell having its operation suspended. The method of bypassing a failing cell or one whose operation is suspended ensures that the solar module 110 (FIG. 1) generates power irrespective of the presence of a failing solar cell 120 in the substring 130.

However, the power dissipated when one or more solar cells 120 is bypassed is substantial, and the operation of the PV solar panel 100 (FIG. 1) will be less efficient. Moreover, the power lost to the system is emitted as heat, which drives thermal considerations in the solar panel layout, the design of the bypass diode 180 and ultimately the cost of the arrangement.

By reducing the voltage drop across the bypass diode when it is conducting, a more efficient PV solar panel can be provided. There is thus a long felt need for a unidirectional bypass element employing an electronic switch having a negligible voltage drop when conducting for use as a PV panel bypass element.

Figure 3A:
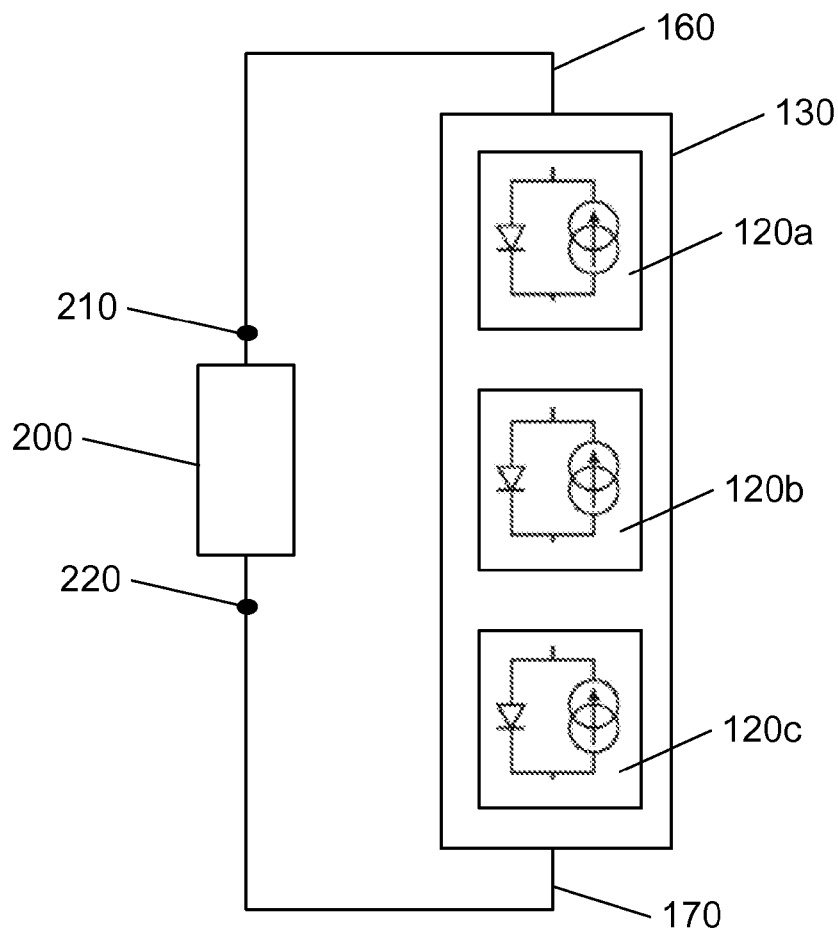
FIGS. 3A and 3B illustrate two possible arrangements for the smart bypass element.
Figure 3B:
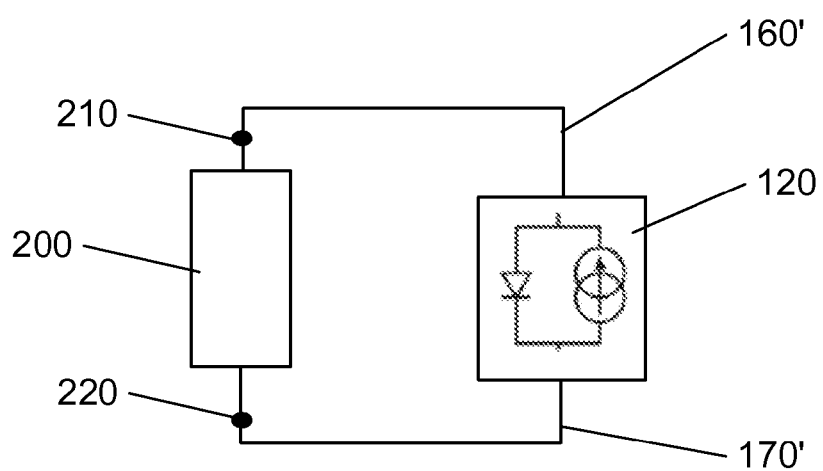

FIGS. 3A and 3B illustrate possible arrangements of a smart bypass element in a solar module. In FIG. 3A, the smart bypass element is associated with a substring for a high voltage application, and, in FIG. 3B, the smart bypass element is associated with a single solar cell for a low voltage operation.

Referring now to FIG. 3A, a substring 130 is shown having first and second nodes 160, 170 as described above with reference to FIG. 2. The substring 130 includes solar cells 120a, 120b, 120c connected in series as before. In this case, the bypass diodes 180a, 180b, 180c of FIG. 2 are replaced with a single smart bypass element 200. As shown, the smart bypass element 200 is connected to first and second terminals 210, 220, the first terminal 210 being connected to the first node 160 and the second terminal 220 being connected to the second node 170 of the substring 130. As described above, the first and second nodes 160, 170 serve as input and output terminals for the substring 130, the first node 160 being the output terminal and the second node 170 being the input terminal.

FIG. 3B is similar to FIG. 3A except that the smart bypass element 200 is connected across a single solar cell 120. First and second nodes 160', 170' act as input and output terminals for the solar cell 120, the first node 160' being the output terminal and the second node 170' being the input terminal. The smart bypass element 200 is connected to first and second terminals 210, 220 which are, in turn, connected to respective ones of the first and second nodes 160', 170' as shown.

During normal operation of the substring 130 (FIG. 3A) or the solar cell 120 (FIG. 3B), if the electrical potential of the first terminal 210 exceeds that of the second terminal 220, the smart bypass element 200 remains open. Under cell failure either of one or more of the solar cells 120a, 120b, 120c in the substring 130 or of the solar cell 120 (or if the operation of one or more solar cells is suspended), the electrical potential of the first terminal 210 will be lower than the one of the second terminal 220 and the smart bypass element 200 will be closed to allow current to flow through the first and second terminals 210, 220 bypassing the substring 130 or the single solar cell 120.

Figure 4:
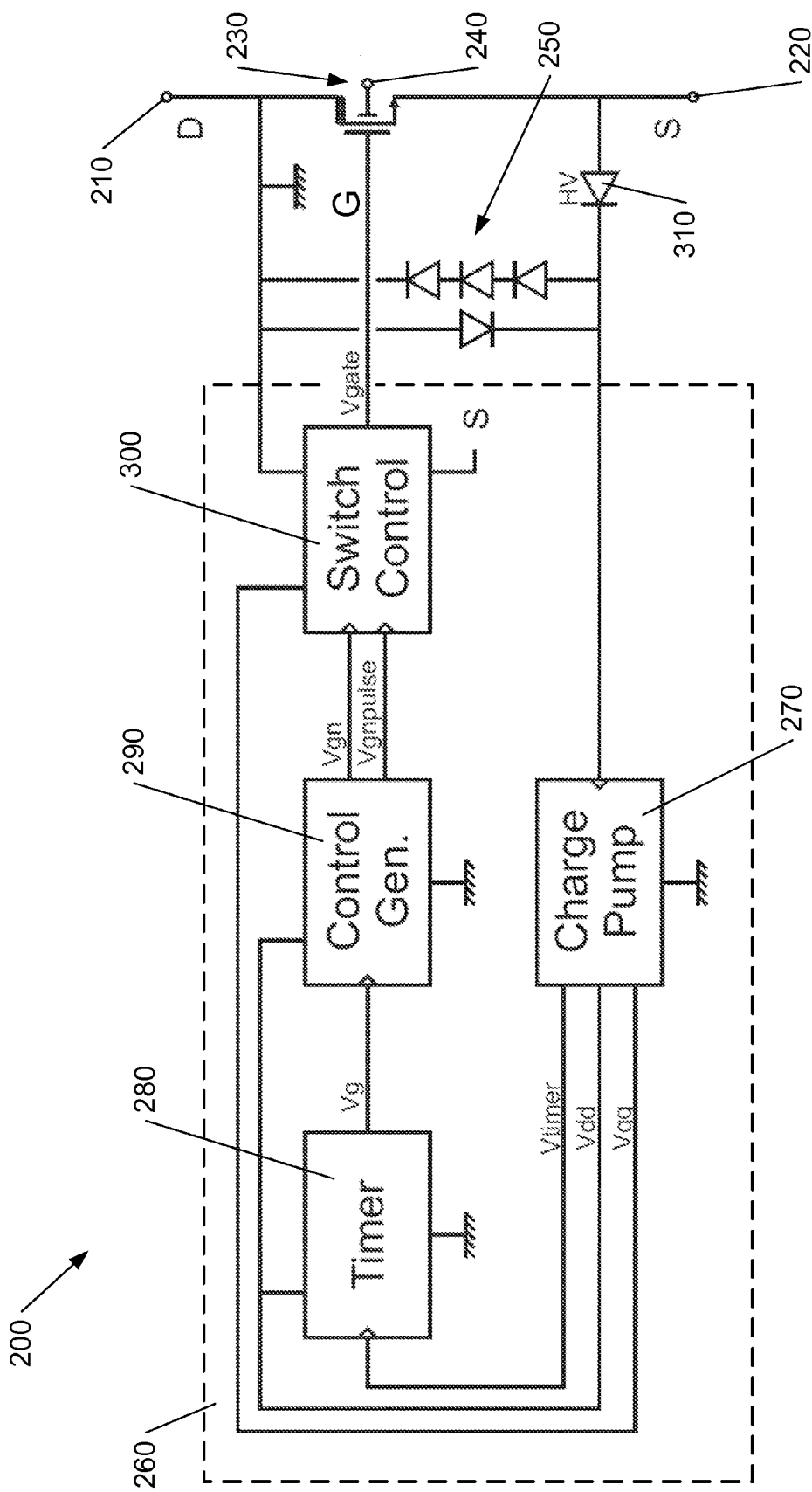
FIG. 4 illustrates a first embodiment of a smart bypass element.

FIG. 4 illustrates an implementation of a smart bypass element 200 together with its first and second terminals 210, 220 in accordance with one embodiment. The smart bypass element 200 comprises a single field effect transistor (FET) 230 arranged to operate as an electronically-controlled switch. Depending whether the application is of high or low voltage, the FET 230 can be an n-channel metal oxide semiconductor FET (NMOSFET or simply NMOS) or an n-channel double-diffused metal oxide semiconductor FET (NDMOSFET or simply NDMOS), although other FET configurations known to the state-of-the art can also be implemented, for example, p-channel metal oxide semiconductor FET (PMOSFET or simply PMOS) or a p-channel double-diffused metal oxide semiconductor FET (PDMOSFET of simply PDMOS).

The drain terminal D of the FET 230 is connected to the first terminal 210 and the source terminal S to the second terminal 220. The gate terminal G is connected to receive a control signal $V_{gate}$ from switch control 300 as will be described in more detail below.

During normal operation of a solar cell, solar cell substring or solar cell array (not shown), the electronically-controlled switch 230 of the smart bypass element 200 remains in an open position. No current flows in either direction through the FET or electronically-operated switch 230. (In the description below, the terms FET and electronically-operated switch are used interchangeably and refer to the FET 230.)

The effective blocking of current flow is provided by designing the FET 230 with a floating bulk terminal 240, that is, the bulk terminal 240 is not connected to the source terminal S. Diodes 250 are arranged in parallel with the FET 230 as shown. The electronically-controlled switch 230 will be activated upon the detection of current flow through the diodes 250. In this way, the overall voltage drop across the solar cell (not shown) is significantly reduced and the smart bypass element will operate as a near ideal diode.

In addition to the FET 230, the smart bypass element 200 includes a detection circuit 260. The detection circuit 260 comprises a charge pump or power converter unit 270, a timer circuit 280, a control generation block 290 and a switch control circuit 300. The detection circuit 260 and its elements are preferably formed on a semiconductor chip.

As shown, the charge pump 270 is connected to the second terminal 220 via a high voltage (HV) diode 310 and provides an output signal $V_{timer}$ for the timer circuit 280; output signal $V_{dd}$ corresponding to the system voltage for the timer circuit 280 and the control generation block 290; and output signal $V_{qq}$ for the switch control circuit 300. The charge pump 270 includes three storage capacitors for storing charge and then generating the timer voltage $V_{timer}$, the switch control voltage $V_{qq}$ and the system voltage $V_{dd}$ respectively. The timer circuit 280 provides a timing signal $V_g$ for the control generation block 290, which, in turn, provides $V_{gn}$ and $V_{gnpulse}$ signals for the switch control circuit 300. The switch control 200 is connected in parallel with the FET 230 with connections to the first terminal 210 and hence to the drain terminal D as well as to the second terminal 220 and hence the source terminal S. The switch control circuit 300 provides a $V_{gate}$ signal for the FET 230. The operation of each of these elements will be described in more detail below.

Once the smart bypass element 200 is activated, the detection circuit 260 checks the potential difference between the first terminal 210 and the second terminal 220 and changes the state of the electronically-controlled switch 230 accordingly.

To create the potential difference between the two terminals 210, 220 of the smart bypass element, the drain terminal D of the FET 230 is connected to an external voltage supply which acts as a reference voltage for the detection circuit 260 and the voltage at the drain terminal $V_D$ can therefore be considered to be 0V. During normal operation, the voltage measured at the source terminal S, $V_S$, of the FET 230 connected to the second terminal 220, will be negative. This voltage can range from −0.6V when only one solar cell is bypassed (FIG. 3B), to a negative range of a couple of 10 s of volts when the smart bypass element 200 is placed over a complete substring 130 (FIG. 3A).

During a solar cell failure or suspension of its operation, current will flow through the parallel diodes 250, putting the FET source terminal S and the second terminal on a positive potential (for example, ~2.0V). This positive potential can be used as a supply voltage to operate the FET or electronically-controlled switch 230. However, once the electronically-controlled switch 230 is activated, this supply voltage disappears and the detection circuit 260 (or chip) has no power left to detect the polarity inversion of the current flowing through the electronically-controlled switch 230, or indeed to deactivate the electronically-controlled switch.

This issue is solved by further connecting the source terminal S to the charge pump 270. The charge pump 270 will set the voltage at a predefined level (depending on the application) and charge a large storage capacitor (not shown but connected to the $V_{dd}$ line), that takes around 200 μs to fully charge. The voltage generated is then used as a voltage supply for the rest of the detection circuit 260 (or chip) and remains fairly constant after the electronically-controlled switch is activated.

The use of the source voltage ($V_S$) generated during solar cell failure to power up the entire smart bypass element 200 (FIGS. 3A and 3B) eliminates the need for the integration of extra external power sources, thus reducing the area overhead of the chip on which the detection circuit 260 is formed.

In order to safeguard the charge pump 270 from voltage fluctuations and ensure that the voltage applied to the input of the charge pump 270 is kept within a predefined range (typically, between 0V and 3.3V), the HV diode 310 connected to the source terminal S of the FET 230 is utilized. An additional advantage of the HV diode 310 is that it ensures the charge pump does not follow the source voltage under normal operation of the solar cell (not shown), which drops to a negative potential.

Once the storage capacitor (not shown) within the charge pump 270 is fully charged, timer circuit 280 will generate control signal $V_g$ to activate the FET or electronically-controlled switch 230 via the control generation block 290 and the switch control circuit 300.

The charge pump 270 is also used to charge second and third capacitors (also not shown) that respectively store the timer voltage $V_{timer}$ and the switch control voltage $V_{qq}$. The timer voltage $V_{timer}$ will slowly drop, and, when it reaches a certain threshold voltage (typically, after around ~100 ms), the timer circuit 280 will adjust $V_g$ to deactivate the FET or electronically-controlled switch 230 via the control generation block 290. The switch control voltage $V_{qq}$ holds charge to charge up a large DMOS gate capacitor when activating the switch via the switch control circuit 300.

If the polarity between the first and second terminals 210, 220 is still reversed, the source voltage ($V_S$) will again rise to ~2.0V and capacitors in the charge pump providing the timer voltage $V_{timer}$, system voltage $V_{dd}$ and switch control voltage $V_{qq}$, will be recharged (~200 μs). If the system has returned to the normal operation, the source voltage ($V_S$) will drop below zero and the electronically-controlled switch 230 will remain open.

As shown in FIG. 4, the FET or electronically-controlled switch 230 is operated from the switch control circuit 300, the output of which is connected to the gate terminal G of the FET 230. The switch control circuit 300 generates a gate voltage $V_{gate}$ according to the potential difference detected across the first terminal 210 and second terminal 220. The switch control circuit 300 ensures that the FET or electronically-controlled switch 230 is maintained at a certain state during the different operation stages of the smart bypass element 200. This is of particular importance during operation of the charge pump 270 where the different voltages, $V_{timer}$ and $V_{dd}$ are generated and where the electronically-controlled switch 230 needs to be maintained open irrespective of the potential difference between the first and the second terminals 210, 220. This is provided by the generation of control signals $V_{gn}$ and $V_{gnpulse}$ from the control generation block 290 in response to the control signals $V_g$ received from the timer circuit 280.

The operation of the smart bypass switch 200 is exemplified in FIGS. 5A to 5D. FIG. 5A illustrates a plot of the cell current $I_{cell}$ over a period of 10 ms. Similarly, FIGS. 5B, 5C and 5D respectively illustrate plots of current $I_{switch}$ flowing through the electronically-controlled switch 230, the source voltage $V_S$ and the gate voltage $V_{gate}$ during the same period. An example of its operation illustrates what happens when polarization inversion occurs (at t=500 μs). While the current, $I_c$, from the other cells, remains 1 A, $I_{cell}$ drops to 0 A as shown in FIG. 5A. IC now runs through the smart bypass element 200. Before that time, $I_{switch}$ (the current through the electronically-controlled switch 230) is 0 A, and both the source and gate of the electronically-controlled switch 230 have a negative voltage. When polarization inversion occurs, the source voltage jumps to a positive voltage (FIG. 5C), while the gate voltage must remain 0V (FIG. 5D) to keep the electronically-controlled switch 230 inactive. After the capacitor in the charge pump generating the system voltage $V_{dd}$ is charged, the gate voltage $V_{gate}$ is pulled up to ~3.3V (FIG. 5D), the source voltage $V_S$ drops to about 75 mV (FIG. 5C) and all the current now flows through the electronically-operated switch 230.

Figure 6:
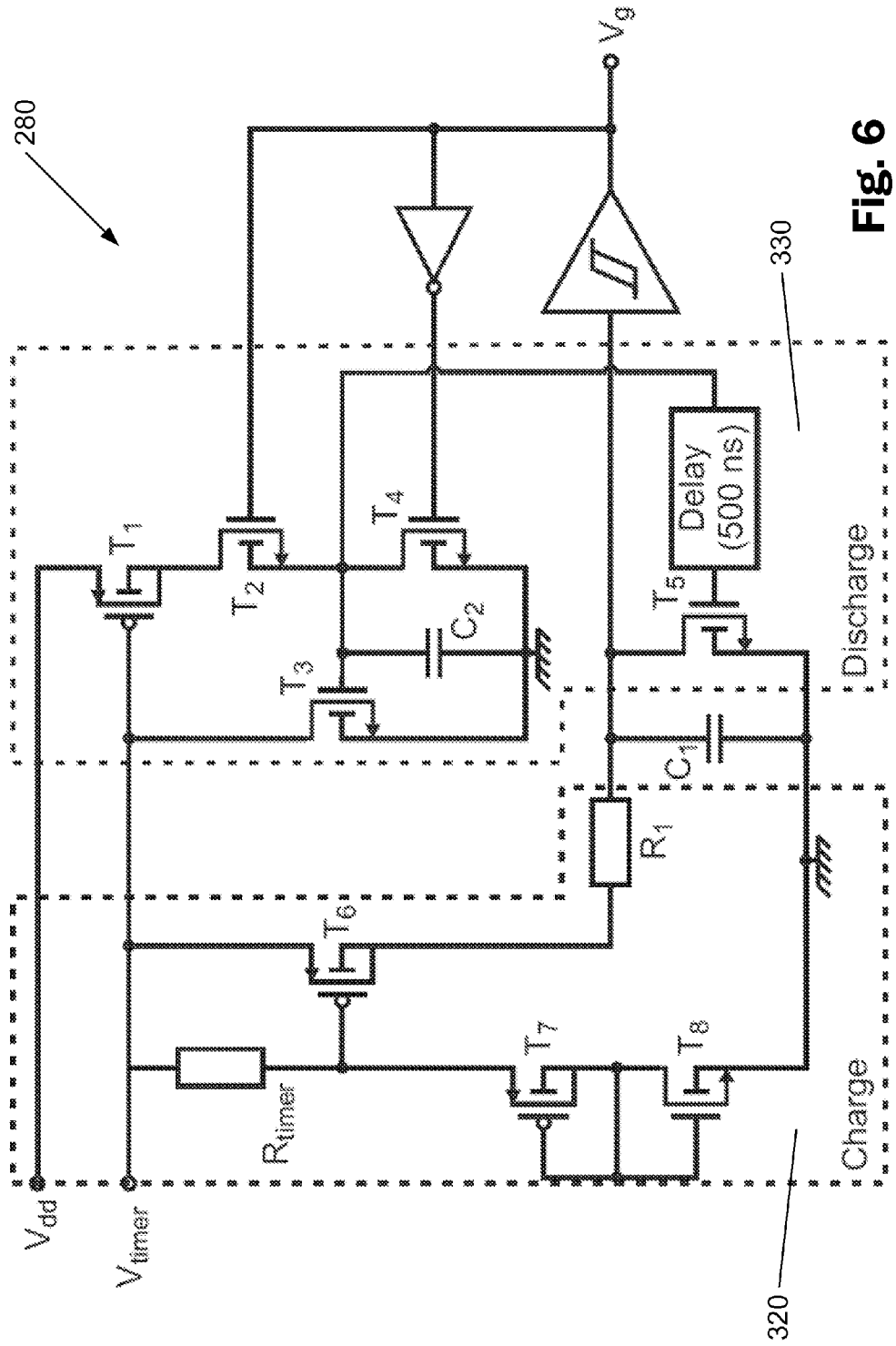
FIG. 6 illustrates an implementation for a timer circuit for the embodiment shown in FIG. 4.

FIG. 6 shows a possible design for the timer circuit 280. The timer circuit 280 comprises a charge circuit 320 and a discharge circuit 330. A capacitor C1 is charged and discharged and the voltage generated is provided as the input for a Schmitt trigger (trigger points 1V and 2V) that generates the control signals for control generation block 290.

Once the charge pump 270 is activated, the charge on the capacitors generating the system voltage $V_{dd}$ and timer voltage $V_{timer}$ will rise slowly (over the course of 200 μs). At the instance where the timer voltage $V_{timer}$ reaches a reference voltage determined by transistors T7 and T8 in the charge circuit 320 (connected as diodes), transistor T6 is activated and C1 is charged through resistor R1.

By the time the voltage on C1 ($V_{C1}$) reaches the threshold voltage of the Schmitt trigger, the capacitors in the charge pump 270, that is, the capacitors for generating the timer voltage $V_{timer}$, switch control voltage $V_{qq}$ and the system voltage $V_{dd}$, are fully charged. The output of the Schmitt trigger changes from a low output to a high output, causing the electronically-controlled switch 230 to activate. This will cause the charge pump 270 to stop working and capacitor for generating the timer voltage $V_{timer}$ will slowly discharge via $R_{timer}$ in the charge circuit 320. $V_{dd}$ will remain about 3.3V, as long as no current is drawn from it.

As a result, in order to keep the system voltage supply $V_{dd}$ constant, it is mandatory that the rest of the circuit uses as little power as possible. This is achieved by providing a discharge circuit 330 in the timer circuit 280. This could be achieved by simply connecting capacitor C1 with a diode to $V_{timer}$ and let $V_{timer}$ slowly drop to 0V. In this case, the voltage on C1 ($V_{C1}$) would follow and the Schmitt trigger would eventually switch back to a low output.

However, from the moment the Schmitt trigger input voltage drops below the threshold voltage of a transistor, current will be drawn from the voltage supply. This current will increase until the lower trigger point is reached. The capacitor generating the system voltage $V_{dd}$ would need to be too big (more than 500 nF) to be able to provide this current (for the whole 100 ms) without having a substantial voltage drop. The discharge circuit quickly discharges the capacitor generating $V_{timer}$ and C1 completely from the moment $V_{timer}$ drops below the PMOS threshold voltage. In this way, the total amount of charge pulled from the storage capacitor, and thus its total size, is greatly reduced (500 pF).

When the capacitor that generates $V_{timer}$ is being charged, transistor T3 in the discharging circuit 330 (FIG. 6) is inactive so that $V_g$ is 0, T4 is active, T2 is inactive. Once the capacitor that generates $V_{timer}$ is charged (T1 inactive) and the electronically switch is activated (T4 inactive, T2 active), T3 must still remain inactive, hence the small capacitor C2 to keep the gate of T3 at a low voltage. When $V_{timer}$ drops below the threshold voltage, T1 becomes active and charges the gate of T3 through T2, causing $V_{timer}$ to drop even more quickly, until it is completely discharged. $V_{C1}$ can be discharged using a diode to $V_{timer}$. However, this means that $V_{C1}$ will not be lower than the typical diode threshold voltage (around 700 mV). If for some reason $V_{dd}$ is lower than expected, for example, if more current is drawn, the associated capacitor is not fully charged up to 3.3V, or the capacitor for generating $V_{timer}$ discharges slower, the input voltage of the Schmitt trigger will remain higher than the trigger point at that supply voltage, making it impossible to deactivate the electronically-operated switch or FET 230. In one embodiment, the lower trigger point of the Schmitt trigger at 2.8V is 672 mV. For this reason, it is safer to also completely discharge the C1 capacitor. However, this must happen after the capacitor for providing $V_{timer}$ is completely discharged, because when $V_g$ drops to 0, T3 is deactivated, preventing the completely discharge of the capacitor providing $V_{timer}$, which will then again charge C 1. For this reason, C1 is discharged with a 500 ns delay.

Figure 7A:
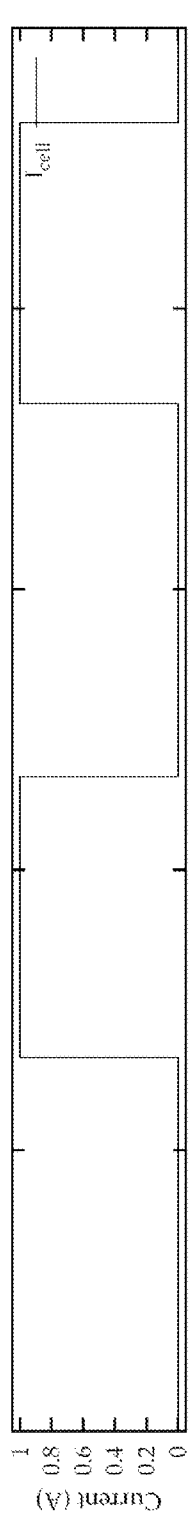
FIGS. 7A to 7D illustrate the operation of the timer circuit shown in FIG. 6.
Figure 7B:
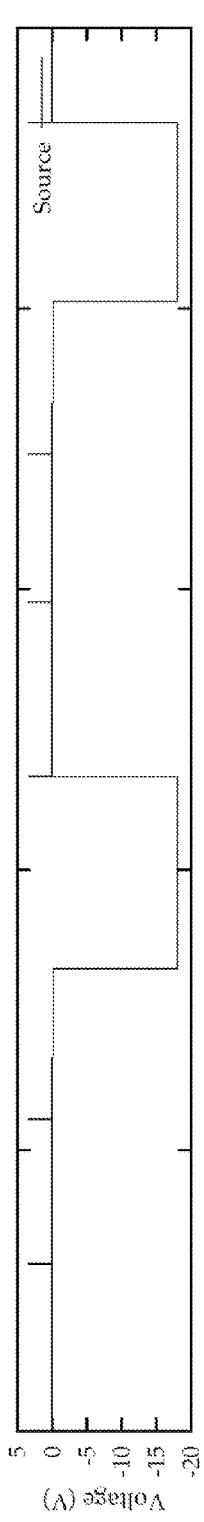
Figure 7C:
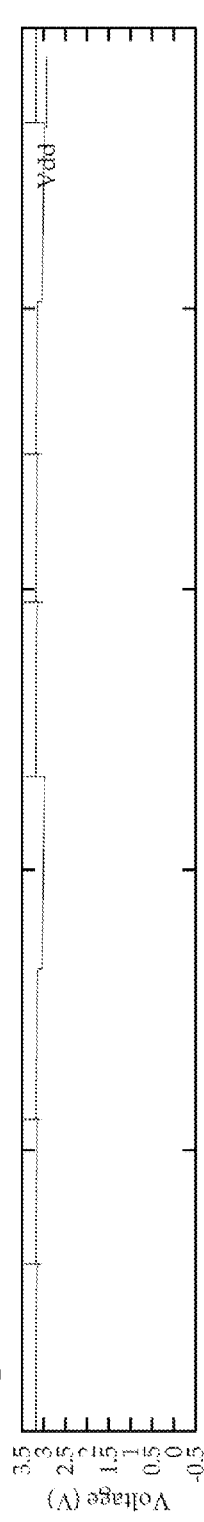
Figure 7D:
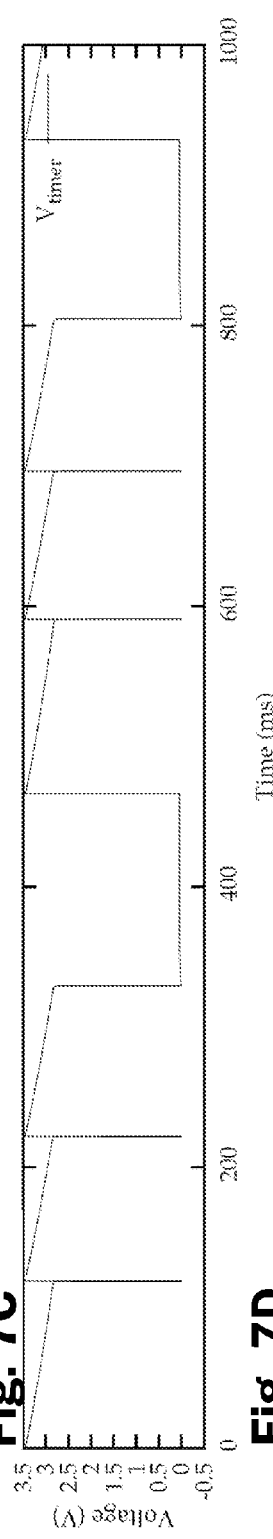

The operation of the timer circuit 280 is shown in FIGS. 7A to 7D. FIG. 7A illustrates a plot of current against time over a period of 1000 ms for the solar cell current, $I_{cell}$. When the solar cell is active, 1 A is generated. When the solar cell is not active, 0 A is generated and the electronically-controlled switch is activated. FIGS. 7B, 7C and 7D illustrate a plot of voltage against time for the same 1000 ms period for the source, the system voltage $V_{dd}$ and the timer voltage $V_{timer}$ respectively.

In FIG. 7B, when the solar cell is not active, the electronically-controlled switch 230 (FIG. 4) is active and the source voltage is low. After about 100 ms, the timer reaches the end of its predetermined period and the switch is deactivated. When the solar cell is not active, for example, at around 200 ms, the source voltage jumps to ~2V and the charge pump 270 (FIG. 4) recharges its capacitors and the switch is activated again. When the solar cell is active, for example, at around 350 ms, when the timer again reaches the end of its predetermined period, the source voltage drops to a negative potential returning the system to normal operation.

FIG. 7C shows that the voltage supply, $V_{dd}$, remains close to 3.3V. If the timer is finished and the solar cell is not active, for example, at 100 ms, the $V_{dd}$ capacitor is discharged. As shown in FIG. 7D, $V_{timer}$ reaches 3.3V and, as its capacitor slowly discharges, it drops to a threshold voltage value after which it is quickly and fully discharged. This coincides with when the timer has reached the end of its predetermined period.

Figure 8:
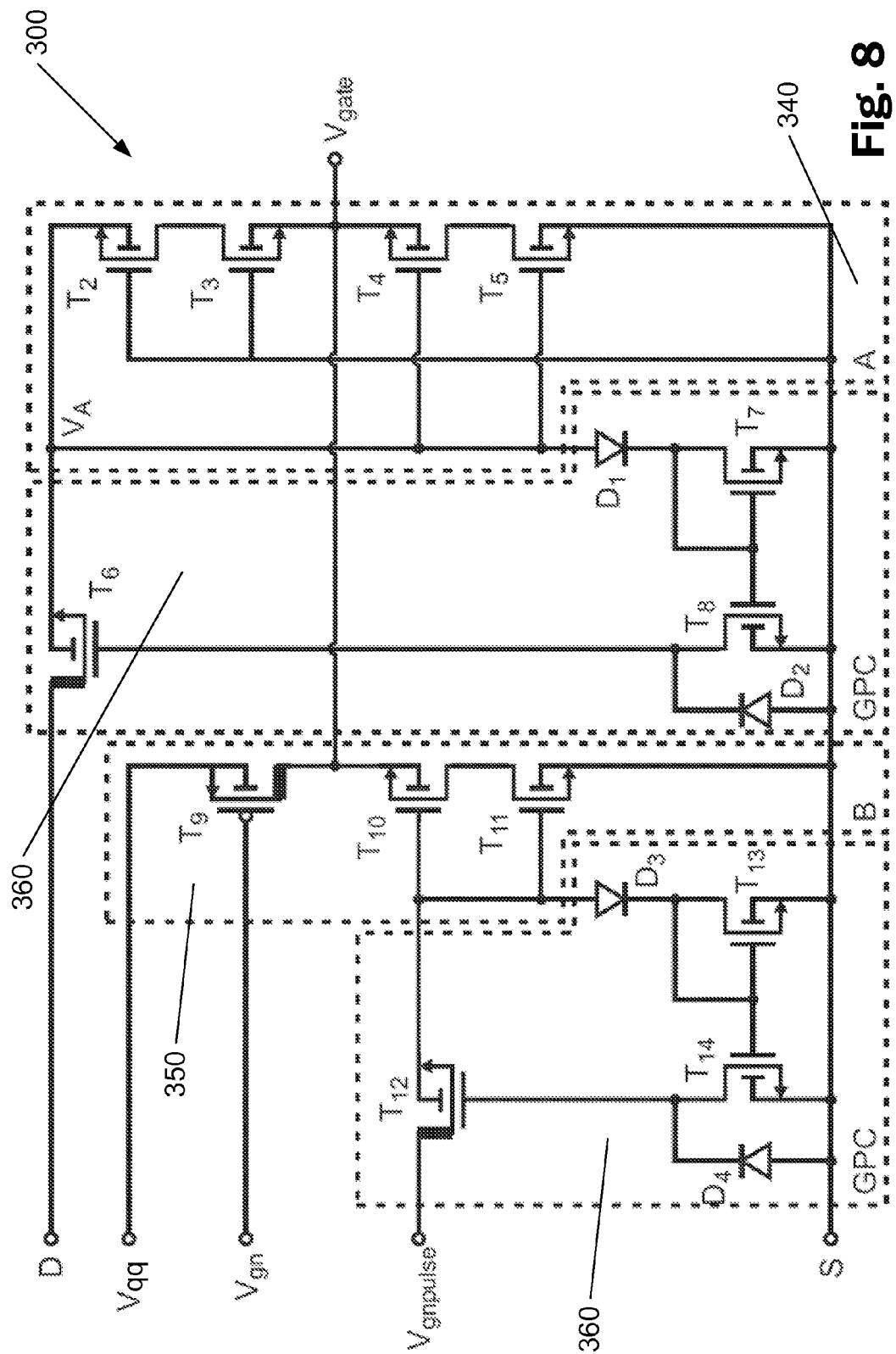
FIG. 8 illustrates an implementation of a switch control circuit for the embodiment shown in FIG. 4.

FIG. 8 shows a possible implementation of the switch control circuit 300. The switch control circuit 300 comprises three distinct circuits, namely, circuit A, labeled as 340, for maintaining the electronically-controlled switch 230 at the off state, circuit B, labeled as 350, for changing the state of the electronically-controlled switch 230, and, the gate protection circuit (GPC) 360 for protecting the gates from over voltage.

Since the source of the electronically-operated switch 230 can either be positive or negative with respect to the drain voltage, the electronically-operated switch 230 cannot be kept off by simply holding the gate voltage on one specific value. If the source voltage is on a (very low) negative voltage, the gate voltage should obviously follow, but, when the source becomes positive, the gate should follow the lowest voltage, that is, the drain voltage at 0V as described above.

This is the function of circuit 340, namely, to hold electronically-controlled switch 230 in the off state. In the case, where the drain voltage is less than the source voltage $V_D<V_S$, transistors T2 and T3 will be activated (T4 and T5 not active) and the $V_{gate}$ will be pulled to the drain voltage. In the case where the source voltage is less than the drain voltage, $V_S<V_D$, transistors T4 and T5 will activate (T2 and T3 not active) and $V_{gate}$ is pulled towards the source voltage. At each time only two transistors are used to ensure that $V_{gate}$ can have any value, 0V, 3.3V, or the source voltage $V_S$, without activating the diodes associated with the transistors. In this particular embodiment, T6, T9 and T12 are DMOS devices.

If the smart bypass element 200 is placed over an array of cells, such as a substring as described above, the source voltage can become very negative. This means that, when no action is taken, the gates of T4 and T5 will break down when their gates are connected to drain voltage $V_D$. The GPC 360 ensures that, from the moment T4 and T5 are activated, their gates are disconnected from the drain voltage by deactivating DMOS T6. In this way, $V_{gate}$, together with T2, T3, T4 and T5 (VA) can float towards the negative source voltage. When $V_S$ becomes positive again, T6 will be activated again through diode D2.

If the smart bypass element 200 is placed over only one solar cell as shown in FIG. 3B, the source voltage will not drop to a dangerously low level, and the GPC 360 can be omitted.

As previously explained, circuit 340 turns the electronically-operated switch 230 (FIG. 4) on and off. Activating the electronically-controlled switch 230 is performed by activating T9 (PDMOS for high voltage applications, PMOS for low voltage applications), which will use the charge of the capacitor associated with generating the switch control voltage $V_{qq}$ to pull $V_{gate}$ up. The source voltage ($V_S$) drops to $V_D$ (0V), so none of transistors (MOSFETs) of circuit 340 are active. Deactivating the electronically-controlled switch 230 is done by pulsing transistors T10 and T11 using the $V_{gnpulse}$ signal, briefly connecting the gate G of the electronically-operated switch to its source S (for periods of 500 ns). If there is still polarization inversion ($V_S>V_D$), the FET or electronically-controlled switch 230 will be appear to be connected as a diode, which creates a voltage drop which is large enough to activate circuit 340. After the pulse, $V_{gate}$ will be pulled to 0V, completely deactivating the electronically-operated switch 230.

If the PV solar cell has returned to normal operation, pulling $V_{gate}$ to the source voltage will completely de-activate the electronically-controlled switch 230, and the source voltage $V_S$ will drop to a negative voltage while $V_{gate}$ follows. Again, since $V_S$ can become very negative the GPC 360 is used to protect the gates of T10 and T11.

Figure 9:
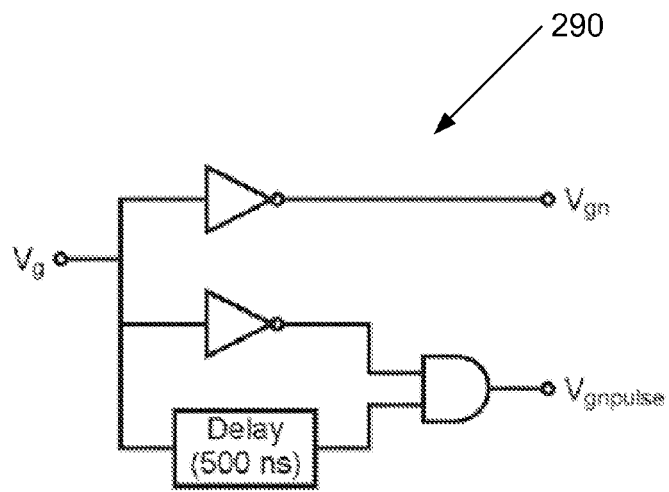
FIG. 9 illustrates an implementation of the control generation block for the embodiment shown in FIG. 4.

The signals that control circuit 350 are generated in the control generation block 290, based on the $V_g$ signal provided by the timer circuit 280 as shown in FIG. 9.

Figure 10:
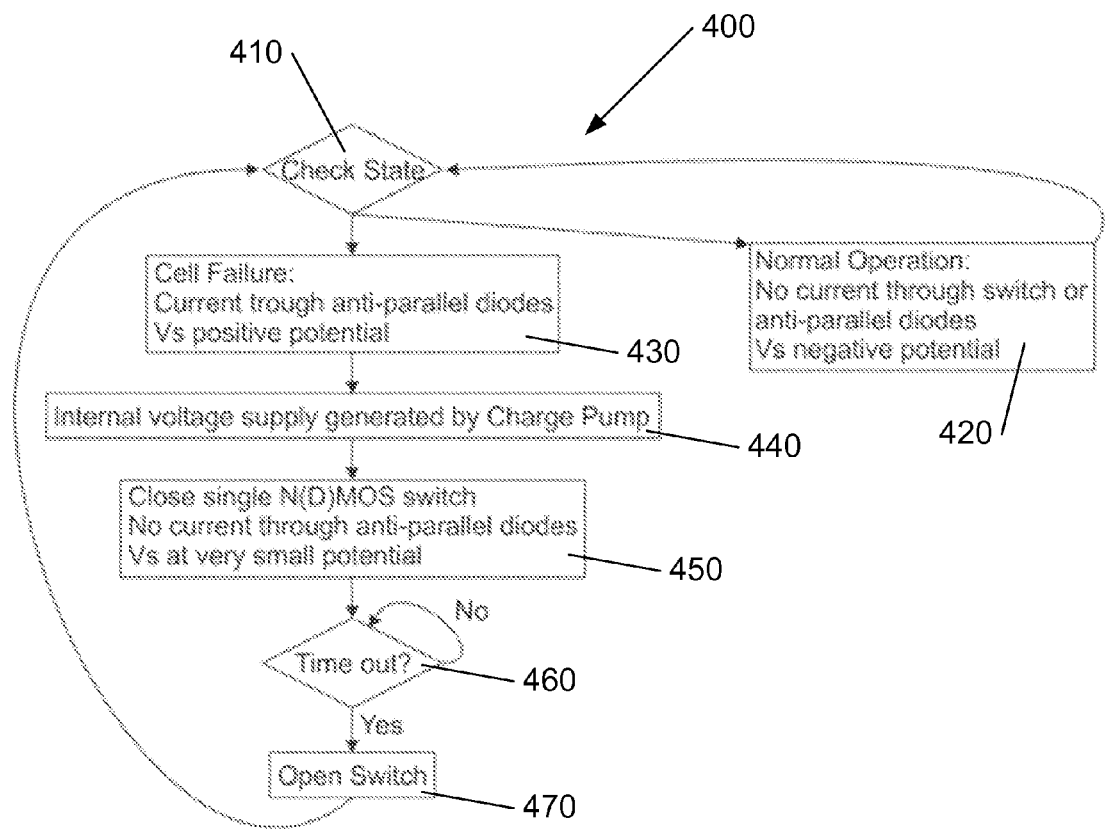
FIG. 10 illustrates a flow diagram of the operation of the smart bypass element shown in FIG. 4.

The method of operation of the smart bypass element 200 is illustrated in FIG. 10 as a flow chart 400 with reference to FIGS. 3A, 3B and 4. The state of the solar cell 120 (or the substring 130) is checked by detecting whether current is flowing through the parallel diodes 250 (step 410). Under normal operation, the FET or electronically-operated switch 230 is maintained open since the current is flowing through the solar cell 120 (step 420). Once electrical current flow is detected in the diodes 250 and the electrical potential of the second terminal 220 exceeds that of the first terminal 230 indicating cell failure or suspended operation (step 430), the charge pump 270 will start operating. Once the storage capacitors in the charge pump 270 are fully charged, the control signals $V_{timer}$, $V_{qq}$ and $V_{dd}$ will be generated (step 440) to close the electronically-controlled switch 230 and to create a bypass across the solar cell 120 (step 450). After a predetermined period defined by the timer circuit 280 (step 460), the status of the solar cell 120 is checked again by opening the electronically-controlled switch 230 (step 470). If cell failure or suspended operation is still detected when the electronically-controlled switch 230 is opened, the switch is closed again and the steps of the process are repeated as required.

Figure 11A:
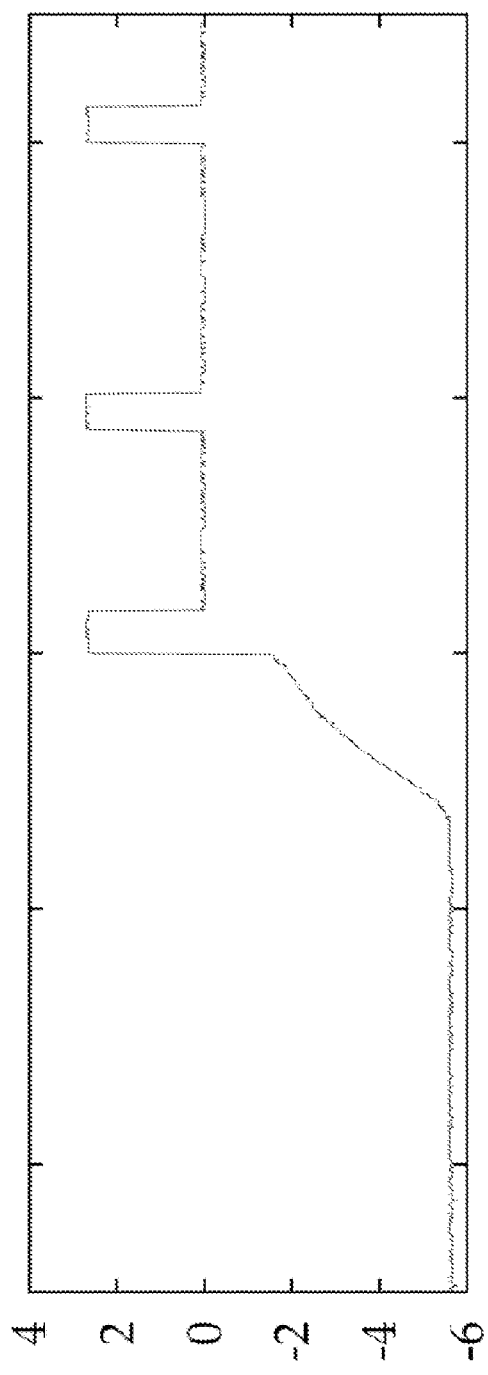
FIG. 11A illustrates experimental results obtained from the embodiment described in FIG. 4.
Figure 11B:
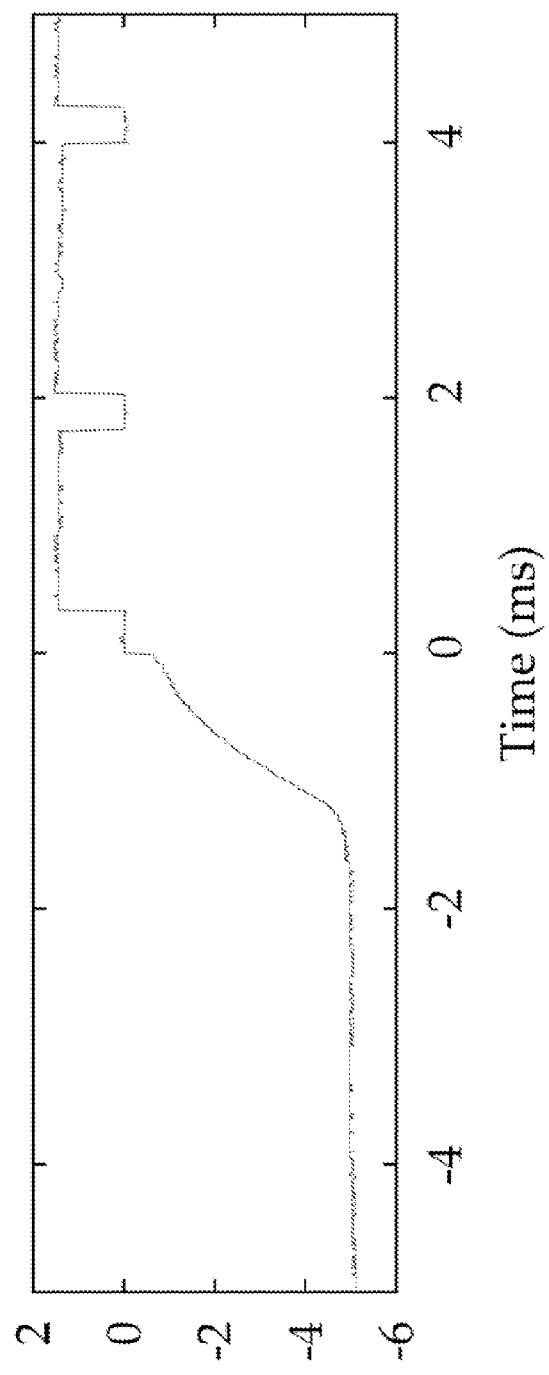
FIG. 11B illustrates experimental results obtained from the embodiment described in FIG. 4.

FIGS. 11A and 11B illustrate respective plots of voltage against time for the source $V_{source}$ and the gate $V_{gate}$ during operation of a smart bypass switch prototyped according to one embodiment. On the testing board, the conditions of a solar panel substring were simulated using diodes and current sources. During normal operation, the substring has a voltage of 5.7V. A failing cell was achieved by flipping a switch to cut off the current. The results obtained show that the smart bypass works as expected.

At −4 ms, the bypass is inactive and the full substring voltage is seen over the bypass. (Drain voltage is the reference voltage here). As shown in FIGS. 11A and 11B, $V_{gate}$ follows $V_{source}$ to keep the bypass from activating. The bypass effectively blocks when $V_{source}$ is less than 0V.

At about −1.5 ms, a cell fails completely or its operation is suspended (the electronically-operated switch is flipped). The current (100 mA during this test) starts flowing through the embedded parallel diodes in the chip and $V_{source}$ starts to rise. This occurs gradually, due to imperfect current sources. When $V_{source}$ becomes positive, $V_{gate}$ locks at 0V, to keep the bypass from activating.

For 300 μs, $V_{source}$ remains high while the charge pump generates the internal voltages. When the bypass is activated, that is, $V_{gate}$ is at 1.5V, $V_{source}$ drops to about 0V. After a couple of ms, the smart bypass samples to check if the voltage is still reversed, and reactivates the bypass if it is.

The measurements show that the bypass has an on-resistance $R_{on}$ of about 0.3Ω. The voltage drop for 500 mA is 150 mV, as shown in FIG. 12.

Figure 12:
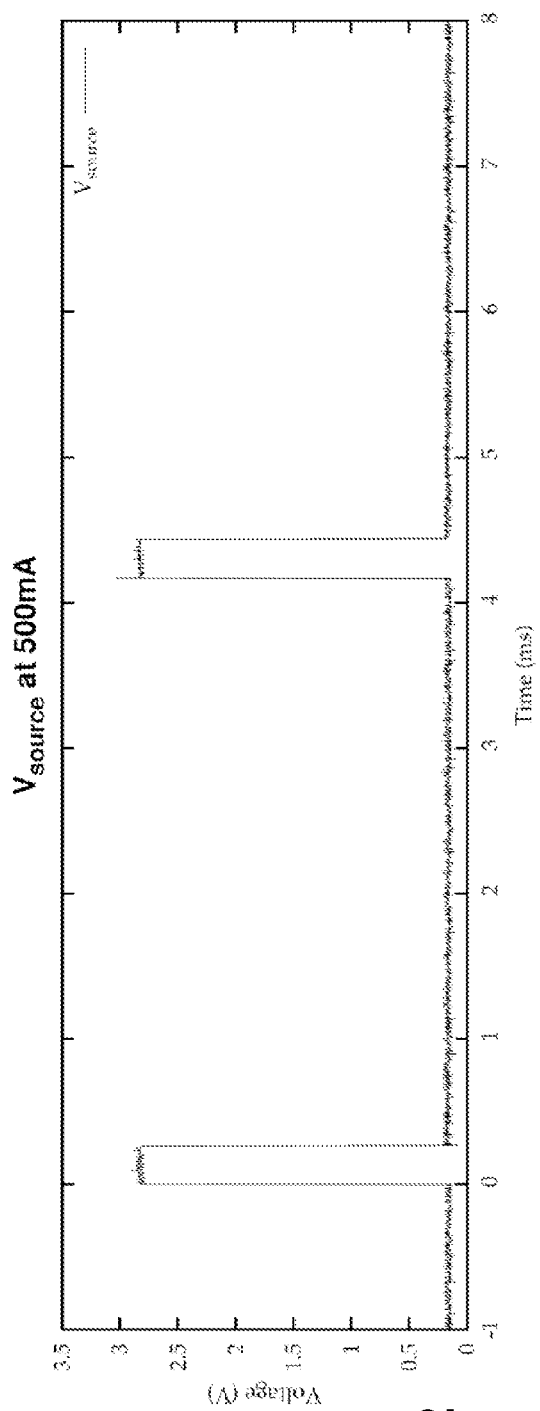
FIG. 12 illustrates experimental results from the operation of a charge pump for the embodiment shown in FIG. 4.

The operation of the charge pump is also shown in FIG. 12. The charge pump is active when the current flows through the embedded diodes ($V_{source}$=2.7V) and generates the voltage to activate the bypass.

Figure 13:
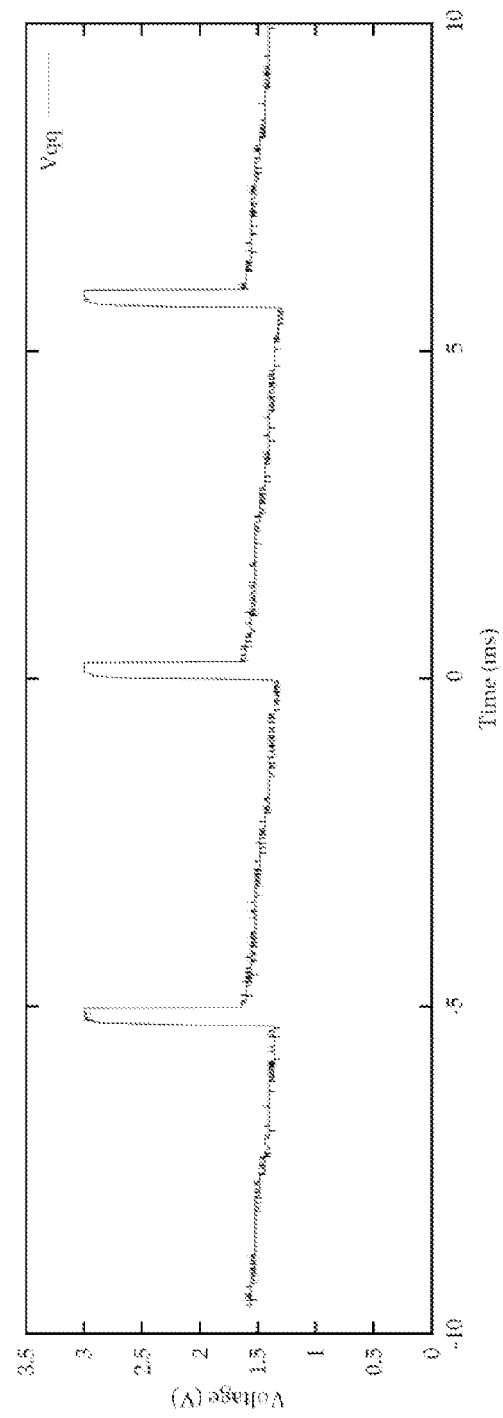
FIG. 13 illustrates the generation of Vqq in the embodiment shown in FIG. 4.

FIG. 13 is a plot of voltage against time illustrating the generation of $V_{qq}$, which is then used to charge the gate capacitance. The gate capacity is about the same size as the charge capacity. During the charging of the gate, the voltage drops to about 1.5V, as calculated. Because of small losses (and also because of the measuring probe), the (gate) voltage drops slowly, but still remains high enough to keep the switch fully active.

By implementing a single FET as a switch in a smart bypass element formed on a chip, the switch occupies less chip area as a chip disclosed in US-A-2009/0184746 acknowledged above. In particular, two serial double-diffused metal oxide semiconductor FET (DMOSFET or simply DMOS) switches (mathematically) occupy four times the area as that of a single DMOS device for the same on resistance, that is, for the same voltage drop for a specific current. This is because:

a) The on resistance of a DMOS is inversely proportional to its area, that is, DMOS area ×2 provides only half the DMOS on resistance, that is, the on resistance of a single DMOS will halve if the area is doubled.

b) The total on resistance of two serially placed DMOS switches is the sum of both individual on resistances.

Therefore, for two serially connected DMOS switches to have the same on resistance R as a single DMOS switch with area A, both DMOS switches each need a resistance of R/2. To obtain an on resistance of R/2, each DMOS switch has an area of 2 A resulting in a total area of 4 A for an on resistance of R. As a result, the area used by two serially connected DMOS switches is 4 times that of a single DMOS switch in accordance with one embodiment.

Additionally, the capacitors in the charge pump that drive the operation of the two serially connected DMOS switches also need to be 4 times larger than the capacitors required to charge a single DMOS switch. The gate capacitance of a DMOS is directly proportional to its size. The gates of two DMOS switches each with area 2 A will have a total capacitance that is four times that of the gate capacitance of a single DMOS switch of area A.

The smart bypass element in one embodiment may have a size of 7.25 mm$^2$ for an on resistance of 300 mΩ and a measured load current of 500 mA. This means that typical sizes of components within the smart bypass element may be:

Timer circuit: 3 mm$^2$
High current diodes: 0.75 mm$^2$
Routing and logic: 1.8 mm$^2$
DMOS: 0.5 mm$^2$
Charge capacitors: 1.2 mm$^2$ The area of the smart bypass element may be reduced to 5 mm$^2$ with a timer circuit of area 0.75 mm$^2$.

When using two serially connected DMOS switches, the total chip size would be 10.1 mm$^2$ for the same resistance due to the quadrupling of both the DMOS area and the charge capacitor area to 2 mm$^2$ and 4.8 mm$^2$ respectively.

For larger currents, the relative size difference would be larger because the size of the timer circuit and other logic blocks remains the same irrespective of the desired load current.

For very large currents, where the full integration is no longer feasible and discrete components, for example, an ASIC control chip and discrete DMOS switches, are needed, the advantage of the smart bypass element approach is still the same. The smart bypass element would only need one discrete DMOS switch whereas the approach described in US-A-2009/0184746 as acknowledged above would need two discrete DMOS switches with higher specification such as lower on resistance etc. as described above.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A low voltage unidirectional smart bypass element suitable for use with at least one photovoltaic solar cell and configured to receive current when the operation of the at least one photovoltaic cell is suspended, the element comprising:
   a first terminal;
   a second terminal;

an electronically-controlled switch arranged between the first and second terminals and configured to allow flow of electrical current between the first terminal and the second terminal when the electronically-controlled switch is closed, the electronically-controlled switch comprising a single field effect transistor having a source terminal, a drain terminal, a gate terminal and a bulk terminal, the bulk terminal configured to be electrically floating; and a detection circuit configured to control the operation of the electronically-controlled switch.

2. A low voltage unidirectional smart bypass element according to claim 1, wherein the detection circuit comprises at least one diode arranged in parallel with the field effect transistor for detecting a potential difference between the first and second terminals.

3. A low voltage unidirectional smart bypass element according to claim 1, wherein the detection circuit further comprises:
- a power converter unit configured to obtain and store electrical energy, the stored electrical energy being output as control signals;
- a timer configured to receive the control signals and to generate a timer control signal at regular time intervals, the control signals being indicative of the amount of electrical energy stored during these regular time intervals;
- a control generation unit configured to receive the timer control signal and to generate switch control signals; and
- a switch control unit configured to receive the switch control signals and to output a gate control signal for controlling the operation of the field effect transistor.

4. A low voltage unidirectional smart bypass element according to claim 3, wherein the power converter unit is arranged for obtaining and storing electrical energy when the electrical potential of the second terminal exceeds the electrical potential of the first terminal.

5. A low voltage unidirectional smart bypass element according to claim 4, wherein the power converter unit is connected to the second terminal via a rectifier circuit.

6. A low voltage unidirectional smart bypass element according to claim 5, wherein the rectifier circuit comprise a high voltage diode.

7. A low voltage unidirectional smart bypass element according to claim 1, wherein the first terminal and second terminals are respectively connected to the drain and source terminals of the field effect transistor.

8. A low voltage unidirectional smart bypass element according to claim 1, wherein the first terminal is connected to a reference voltage source.

9. A low voltage unidirectional smart bypass element according to claim 8, wherein the reference voltage source is at ground.

10. A low voltage unidirectional smart bypass element according to claim 1, wherein operation of the electronically-controlled switch is controlled via its gate terminal in response to the electrical potential difference detected by the detection circuit between the first and second terminals.

11. A low voltage unidirectional smart bypass element according to claim 1, wherein the field effect transistor comprises at least one of: an n-channel metal oxide semiconductor field effect transistor, a p-channel metal oxide semiconductor field effect transistor, an n-channel double-diffused metal oxide semiconductor field effect transistor, and a p-channel double-diffused metal oxide semiconductor field effect transistor.

12. A photovoltaic solar array comprising a plurality of photovoltaic solar cells arranged in at least one substring within the array, and a low voltage unidirectional smart bypass element according to claim 1 connected in parallel across each substring, and configured to provide an alternative current path between an input node and an output node when the operation of at least one photovoltaic solar cell is suspended.

13. A photovoltaic solar panel comprising:
- an input node;
- an output node; and
- at least one photovoltaic solar array according to claim 12 connected between the input and output nodes.

14. A photovoltaic solar panel comprising:
- an input node;
- an output node;
- at least two solar cells connected in series and connected between the input and output nodes; and
- at least one low voltage unidirectional smart bypass element according to claim 1, and arranged for providing an alternative current path between the input node and output node when the operation of at least one solar cell in the array is suspended.

15. A device comprising:
- a plurality of photovoltaic solar cells arranged in at least one substring; and
- a low voltage unidirectional smart bypass element connected in parallel across each of the at least one substring and configured to provide an alternative current path between an input node and an output node when the operation of at least one photovoltaic solar cell is suspended, wherein the element comprises:
  - a first terminal;
  - a second terminal;
  - an electronically-controlled switch arranged between the first and second terminals and configured to allow flow of electrical current between the first terminal and the second terminal when the electronically-controlled switch is closed, the electronically-controlled switch comprising a single field effect transistor having a source terminal, a drain terminal, a gate terminal and a bulk terminal, the bulk terminal configured to be electrically floating; and
  - a detection circuit configured to control the operation of the electronically-controlled switch.

16. A device according to claim 15, wherein the detection circuit comprises at least one diode arranged in parallel with the field effect transistor for detecting a potential difference between the first and second terminals.

17. A device according to claim 15, wherein the detection circuit further comprises:
- a power converter unit configured to obtain and store electrical energy, the stored electrical energy being output as control signals;
- a timer configured to receive the control signals and to generate a timer control signal at regular time intervals, the control signals being indicative of the amount of electrical energy stored during these regular time intervals;
- a control generation unit configured to receive the timer control signal and to generate switch control signals; and
- a switch control unit configured to receive the switch control signals and to output a gate control signal for controlling the operation of the field effect transistor.

18. A device according to claim 15, wherein the first terminal and second terminals are respectively connected to the drain and source terminals of the field effect transistor.

19. A low voltage unidirectional smart bypass element suitable for use with at least one photovoltaic solar cell and configured to receive current when the operation of the at least one photovoltaic cell is suspended, the element comprising:
- a first terminal;
- a second terminal;
- a single field effect transistor arranged between the first and second terminals and configured to allow flow of electrical current between the first terminal and the second terminal when the transistor is closed, the transistor having a source terminal, a drain terminal, a gate terminal and a bulk terminal, the bulk terminal configured to be electrically floating; and
- means for controlling the operation of the electronically-controlled switch.

* * * * *